(12) United States Patent  
Ali et al.

(10) Patent No.: US 7,609,776 B2  
(45) Date of Patent: Oct. 27, 2009

(54) QUADRATURE FREQUENCY CHANGER, TUNER AND MODULATOR

(75) Inventors: Isaac Ali, Bristol (GB); Nicholas Paul Cowley, Wroughton (GB)

(73) Assignee: Intel Corporation, Santa Clara, CA (US)

( * ) Notice: Subject to any disclaimer, the term of this patent is extended or adjusted under 35 U.S.C. 154(b) by 609 days.

(21) Appl. No.: 11/464,596

(22) Filed: Aug. 15, 2006

(65) Prior Publication Data

US 2007/0042744 A1 Feb. 22, 2007

(30) Foreign Application Priority Data

Aug. 16, 2005 (GB) ................... 0516768.9

(51) Int. Cl.
  *H04L 5/12* (2006.01)
  *H04B 1/26* (2006.01)
(52) U.S. Cl. .................... 375/261; 455/323
(58) Field of Classification Search ............... 375/261, 375/298, 322, 324; 455/323, 302, 313, 318
   See application file for complete search history.

(56) References Cited

U.S. PATENT DOCUMENTS

| 6,895,063 B1* | 5/2005 | Cowley et al. ........... 375/376 |
| 6,937,670 B2* | 8/2005 | Cowley et al. ........... 375/324 |
| 7,196,739 B2* | 3/2007 | Coe et al. ............... 348/731 |
| 2002/0055337 A1* | 5/2002 | Persico et al. ........... 455/112 |
| 2003/0087614 A1* | 5/2003 | Kramer .................... 455/112 |
| 2004/0121738 A1* | 6/2004 | Ide ......................... 455/82 |

FOREIGN PATENT DOCUMENTS

| DE | 199 14 384 A1 | 12/1999 |
| EP | 0 576 078 A1 | 12/1993 |
| GB | 2 341 502 A | 3/2000 |
| WO | WO 03/007471 A2 | 1/2003 |

* cited by examiner

*Primary Examiner*—Khanh C Tran  
(74) *Attorney, Agent, or Firm*—Blakely, Sokoloff, Taylor & Zafman LLP

(57) ABSTRACT

A quadrature frequency changer comprising first and second mixers and a local oscillator and a tuner and modulator including the quadrature frequency changer are provided. The local oscillator provides first and second commutating signals which are nominally in phase-quadrature and includes an arrangement for changing the phase of the first commutating signal by 180° to provide a third commutating signal. The first mixer comprises first and second mixing stages for mixing an input signal with the first and second commutating signals and a summer for summing the mixer stage output signals. The second mixer comprises third and fourth mixing stages for mixing the same or a different input signal with the second and third commuting signals and a summer for summing the third and fourth mixer stage output signals.

10 Claims, 7 Drawing Sheets

QUADRATURE FREQUENCY CHANGER, TUNER AND MODULATOR

CROSS-REFERENCE TO RELATED APPLICATION

This application claims priority to British Patent Application Serial Number GB 0516768.9, filed Aug. 16, 2005, which is herein incorporated by reference.

FIELD OF THE INVENTION

Embodiments of the present invention relate to a quadrature frequency changer and to a tuner and a modulator including such a frequency changer. Such a tuner may be used, for example, for receiving analog or digital television, audio, data or telephony broadcasts via, for example terrestrial or satellite broadcast or cable distribution. Such a modulator may be used, for example, to encode signals for transmission or distribution at radio frequency.

BACKGROUND

FIG. 1 of the accompanying drawings illustrates a known type of quadrature frequency converter. The frequency converter comprises two signal paths containing an in-phase (I) mixer 1 and a quadrature (Q) mixer 2. The mixer receives commutating signals, which are intended to be in phase-quadrature with respect to each other, from a local oscillator 3 via a quadrature splitter 4 and mixes the signal in each signal path with the respective commutating signal to generate in-phase and quadrature output signals $I_O$ and $Q_O$. The "quality" of the quadrature output signals is determined at least in part by amplitude imbalances between the signal paths and quadrature phase imbalances between the quadrature commutating signals.

Gain imbalances may be reduced on the order of 0.1 dB by good design and layout techniques. However, quadrature phase imbalances are more difficult to reduce to levels which provide acceptable quadrature frequency changing performance. For example, in arrangements where the frequency of the local oscillator 3 is required to vary by an octave or more, it is difficult to reduce phase imbalances to less than 3° across the frequency band of operation.

A known technique for reducing quadrature phase errors is to supply the quadrature commutating signals to a double-balanced or a double-double-balanced mixer. Such a mixer produces an error signal proportional to the phase error from 90° from the commutating signals and this error signal may be used to control a feedback loop including the quadrature splitter 4 so as to reduce phase imbalance. However, such an arrangement is relatively complex and inconvenient.

In FIG. 1, the phase error from 90° between the commutating signals is represented by a phase error or shift of φ° added to the in-phase or 0° commutating signal whereas the quadrature or 90° signal is uncontaminated. The commutating signals are illustrated as vectors in the graph of FIG. 2 in the accompanying drawings and, when applied to the mixers 1 and 2, result in the same phase imbalance or error in the converted output signals $I_O$ and $Q_O$. The phase error φ° has to be reduced to a value which is sufficiently low to provide acceptable operation of the quadrature frequency converter.

SUMMARY OF THE INVENTION

One embodiment of the invention provides a quadrature frequency changer. The quadrature frequency changer generally includes first and second mixers and a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

Another embodiment of the invention provides a tuner. The tuner generally includes a quadrature frequency changer comprising first and second mixers and a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

Yet another embodiment provides a modulator. The modulator generally includes a quadrature frequency changer comprising first and second mixers and a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Like reference numerals refer to like parts throughout the drawings.

DETAILED DESCRIPTION

Figure 3:
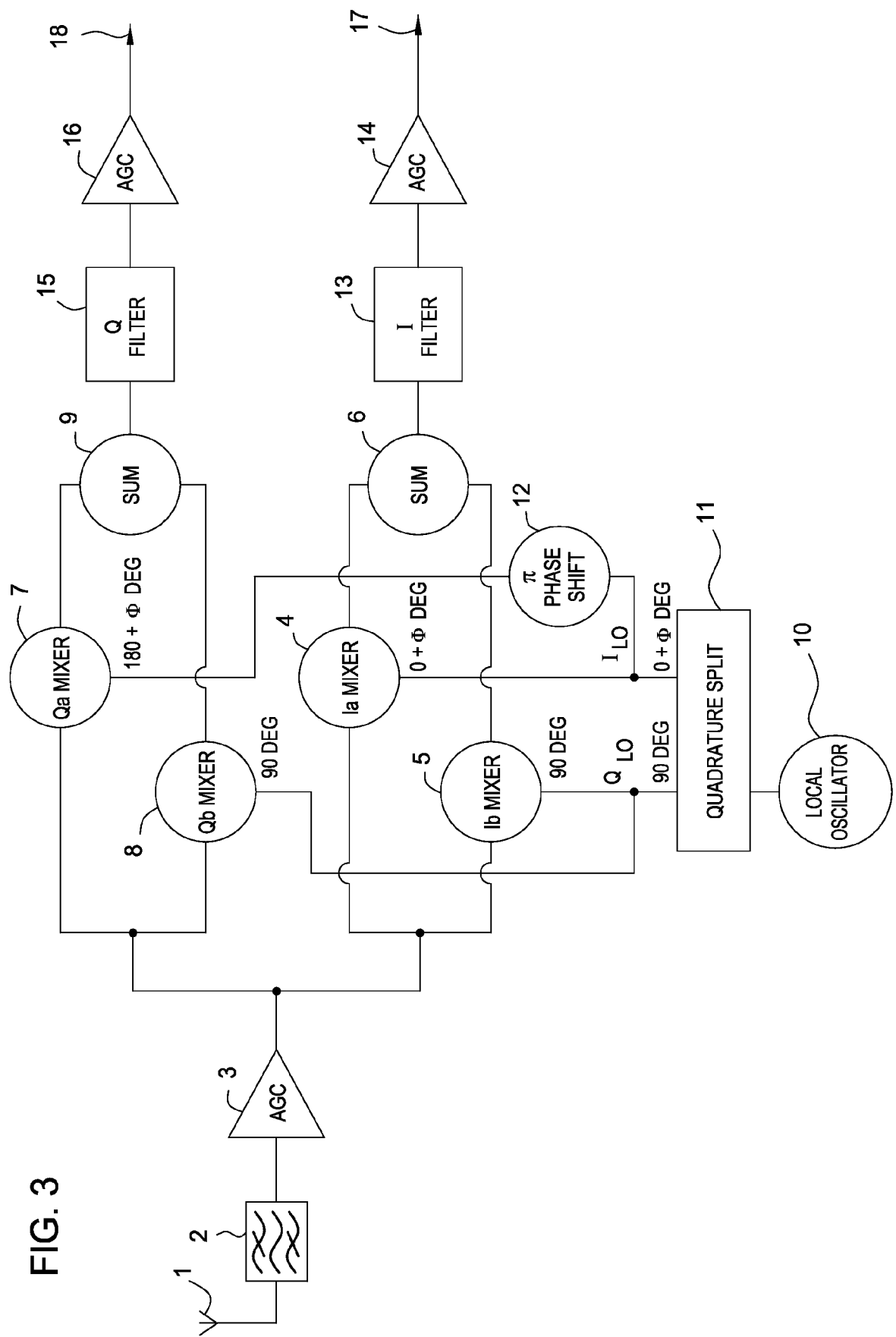
FIG. 3 is a block circuit diagram of a direct conversion or zero intermediate frequency tuner including a quadrature frequency changer according to one embodiment of the invention.

FIG. 3 illustrates a tuner of the zero intermediate frequency (ZIF) type, in which any desired channel in a broadband radio frequency input signal can be selected and converted to quadrature baseband in-phase (I) and quadrature (Q) output signals. The tuner may have an input 1, for example, for connection to a terrestrial aerial, a satellite aerial system or a cable distribution network. The input 1 may be connected to a tracking radio frequency bandpass filter 2, whose passband tracks the frequency of the selected channel and whose bandwidth is sufficient to pass the selected channel with minimal attenuation together with several adjacent channels. Alternatively, the filter 2 may be fixed, for example, to provide a band limit function or may be omitted. The output of the filter 2 may be supplied to an automatic gain control (AGC) stage 3, which provides amplification and control of gain so as to supply a consistent signal level to the frequency changer.

The frequency changer may comprise an I mixer, comprising mixing stages 4 and 5 and a summer 6, and a Q mixer, comprising mixing stages 7 and 8 and a summer 9. The frequency changer may further comprise a local oscillator 10, a quadrature splitter 11 and a phase shifter 12 for shifting the phase of the incoming signals by $\pi$ radians or 180°.

The mixing stages 4, 5, 7 and 8 may have signal inputs, which are connected together and to the output of the stage 3. The outputs of the mixing stages 4 and 5 may be vectorially summed by the summer 6, whose output may comprise the output of the I mixer. Similarly, the outputs of the mixing stages 7 and 8 may be summed by the summer 9, whose output may provide the Q output of the Q mixer. The mixing stages 5 and 8 may have commutating inputs connected to receive a commutating signal from the quadrature splitter 11 having a relative phase of 90°. The mixing stage 4 may have a commutating input connected to the quadrature splitter 11 to receive a commutating signal having a nominally 0° relative phase, but which may include a phase imbalance of $\phi°$. This signal may also be supplied to the phase shifter 12, which may provide accurate phase shifting by 180°, for example by inverting the input waveform. The output signal of the shifter 12 should thus have a relative phase of 180°+$\phi°$, and this may be supplied as the commutating signal to the commutating input of the mixing stage 7.

The output of the I mixer from the summer 6 may be supplied to an I filter 13, which may have a passband sufficient for passing the desired I component at baseband and for attenuating adjacent channels. The output of the filter 13 may be supplied to another AGC stage 14, whose output may be connected to the I output 17 of the tuner. Similarly, the output of the Q mixer from the summer 9 may be supplied to a Q filter 15, which may be substantially identical to the filter 13. The filtered output may be supplied to another AGC stage 16, whose output may be connected to the Q output 18 of the tuner.

Figure 1:
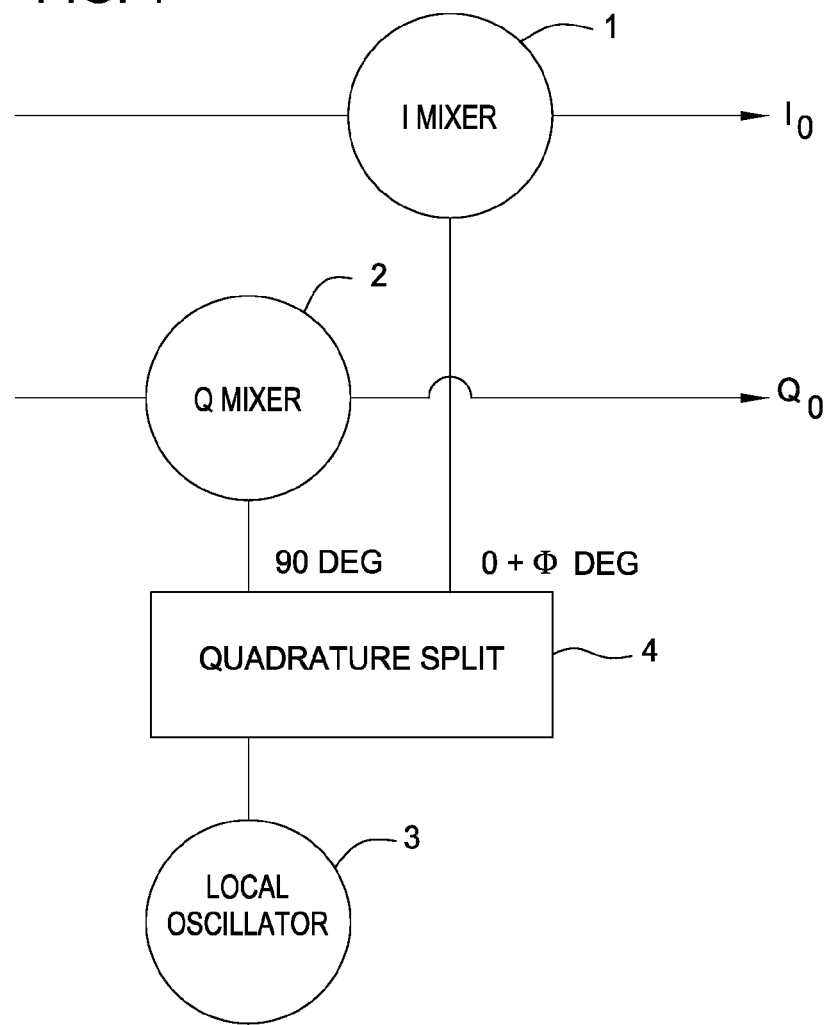
FIG. 1 is a prior art block circuit diagram of a known type of quadrature frequency converter.
Figure 2:
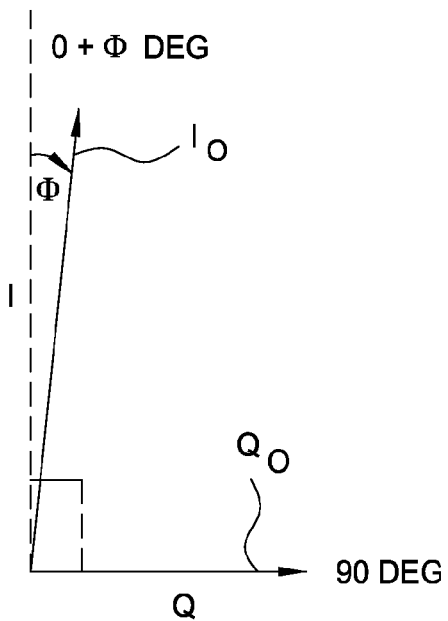
FIG. 2 is a prior art phase or vector diagram illustrating operation of the frequency changer of FIG. 1.
Figure 4:
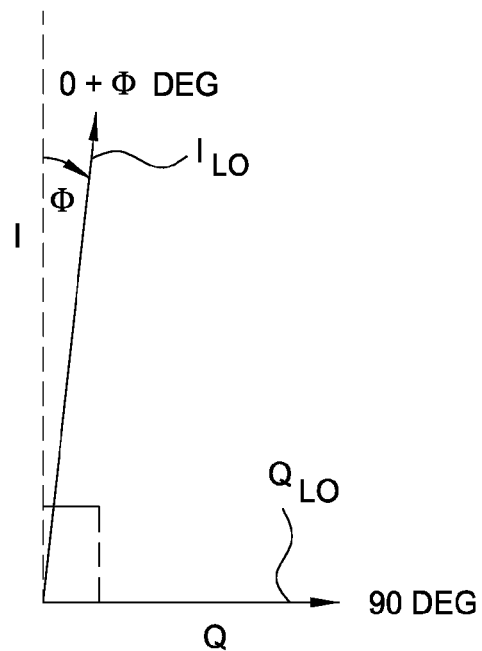
FIG. 4 repeats the diagram of FIG. 2 in the context of the frequency changer shown in FIG. 3 according to one embodiment of the invention.

FIG. 4 illustrates the actual phases of the nominally quadrature-phase local oscillator signals $I_{LO}$ and $Q_{LO}$. There may be a quadrature imbalance of $\phi°$ between the local oscillator signals, and this is illustrated (without any loss of generality) as being superimposed on the in-phase commutating signal. The relative phase of the local oscillator quadrature signals substantially determines the relative phase of the I and Q mixer output signals in a conventional quadrature frequency changer of the type shown in FIG. 1 and the resulting quadrature imbalance results in contamination or crosstalk between the quadrature output signals.

Figure 5:
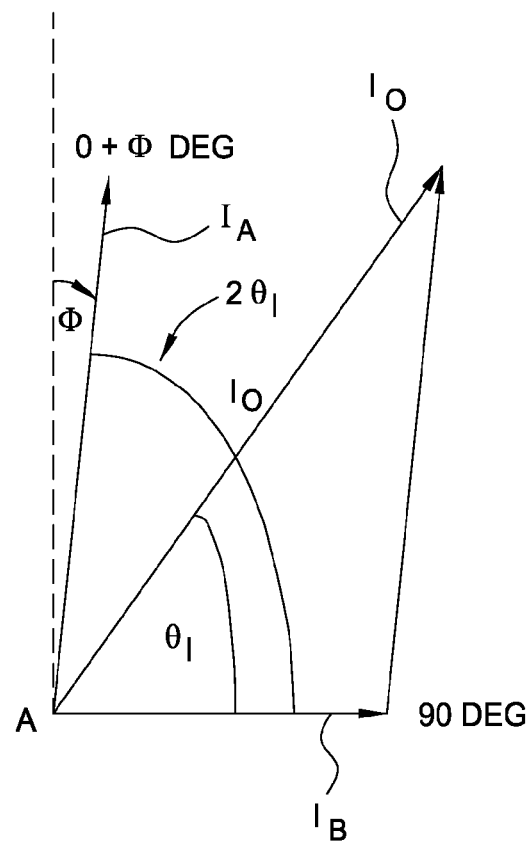
FIGS. 5 and 6 are vector diagrams illustrating operation of the frequency changer shown in FIG. 3 according to one embodiment of the invention.

FIG. 5 is a vector diagram illustrating the operation of the I mixer. The mixing stage 4 may receive the commutating signal $I_{LO}$ and convert the input signal to a frequency-converted signal having the same relative phase. This signal is illustrated at $I_A$ in FIG. 5. Similarly, the mixing stage 5 may convert the input signal to the frequency-converted signal with the phase illustrated at $I_B$ in FIG. 5. The summer 6 may form the vector sum of the signals $I_A$ and $I_B$ to form the output signal $I_O$ with the vector $I_O$ bisecting the angle $2\theta_1$ between the vectors $I_A$ and $I_B$. The angle $\theta_1$ from the horizontal axis is given by $$\theta_1 = \frac{90 - \Phi}{2}$$

Figure 6:
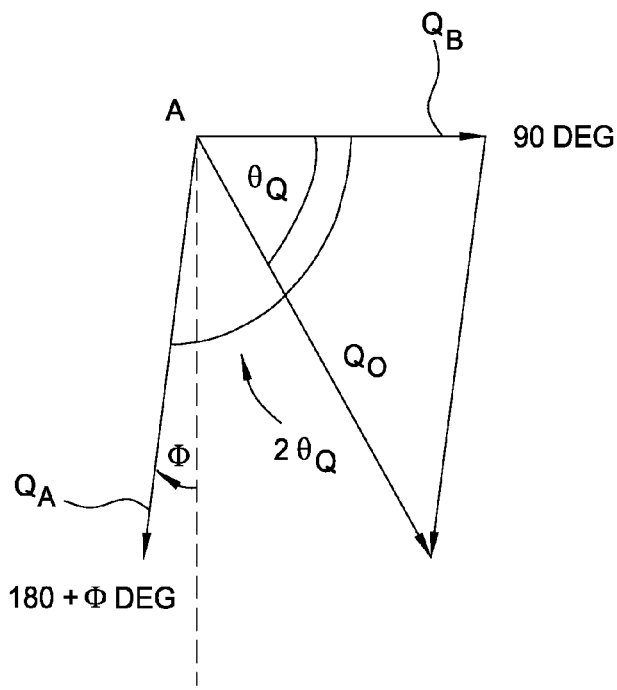

FIG. 6 illustrates the operation of the Q mixer in the same format. The mixing stage 8 may frequency-convert the incoming signal to the output signal $Q_B$ with a relative phase of 90°. The mixing stage 7 may produce the frequency-converted output signal $Q_A$ with a relative phase of 180°+$\phi$, and the summer 9 may form the vector sum in an effort to provide the Q mixer output signal $Q_O$ with a phase angle of $\theta_Q$ below the horizontal axis, which phase angle is given by:

$$\theta_Q = \frac{90 + \Phi}{2}$$

The relative phase between the output signals $I_O$ and $Q_O$ is given by:

$$\theta_1 + \theta_Q = \frac{90 - \Phi}{2} + \frac{90 + \Phi}{2}$$
$$= \frac{90}{2} - \frac{\Phi}{2} + \frac{90}{2} + \frac{\Phi}{2}$$
$$= 90°$$

The effect of this should be that the phase error $\phi$ is effectively cancelled by the mixing processes in the frequency changer. Thus, quadrature phase errors may be theoretically removed so that the quadrature output signals are theoretically in perfect phase-quadrature. In practice, perfect cancellation may not be achieved, but the reduction in quadrature phase imbalance provided by the frequency changer represents a substantial improvement in quadrature balance and does not require any complicated control loops.

Figure 7:
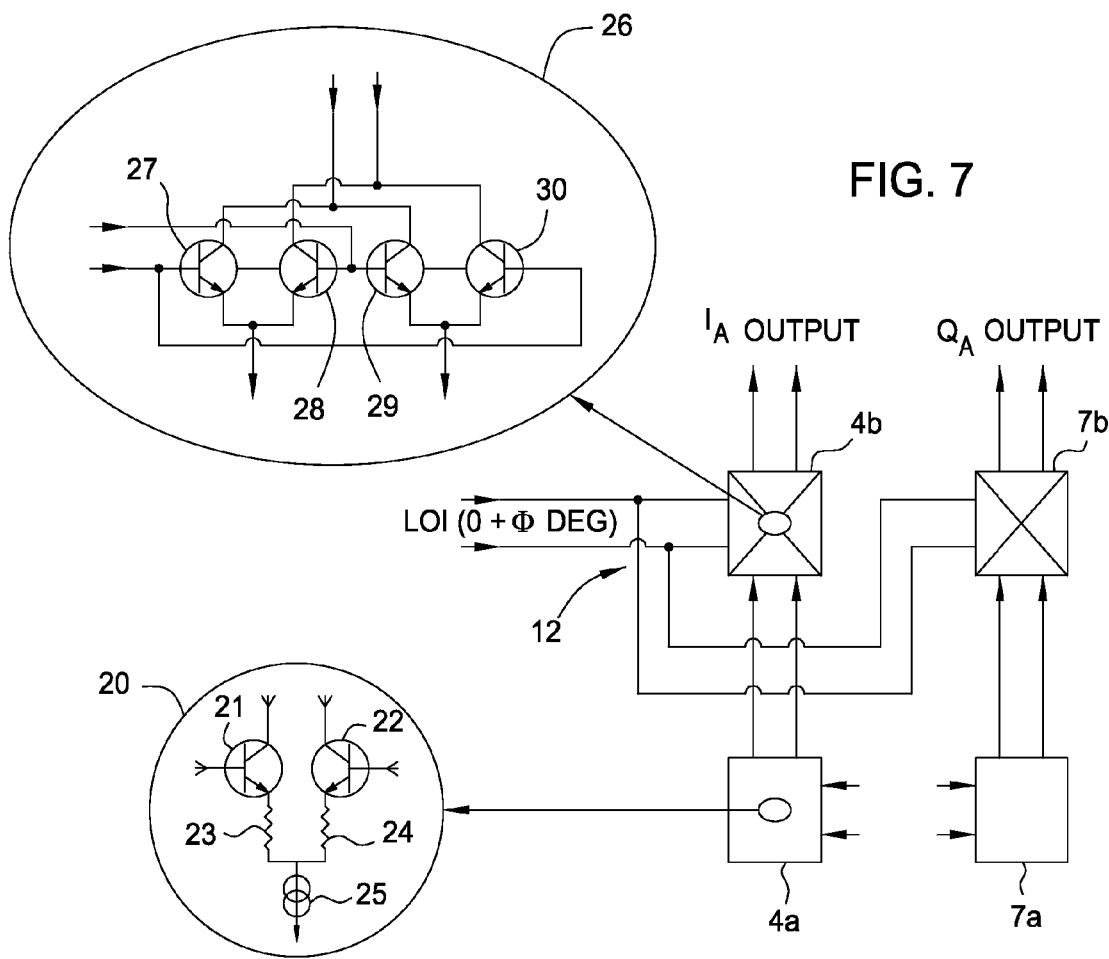
FIG. 7 is a circuit diagram illustrating part of the frequency changer shown in FIG. 3 according to one embodiment of the invention.

FIG. 7 illustrates an example of the circuit structure and interconnection of the mixing stages 4 and 7 and the phase shifter 12. The mixing stages may be of the Gilbert cell type comprising transconductance stages 4a and 7a and current switching cells 4b and 7b. As shown in the inset at 20, each transconductance stage may comprise a long tail pair of transistors 21 and 22 provided with emitter degeneration resistors 23 and 24 and a constant tail current source 25. The inset 26 illustrates each switching cell, which may comprise transistors 27 to 30. The emitters of the transistors 27 and 28 may be connected to the collector of the transistor 21, whereas the emitters of the transistors 29 and 30 may be connected to the collector of the transistor 22. The collectors of the transistors 27 and 29 may be connected together to form a first differential output line whereas the collectors of the transistors 28 and 30 may be connected together to form a second differential output line. The bases of the transistors 27 and 30 may be connected together to form a first differential commutating input line, whereas the bases of the transistors 28 and 29 may be connected together to form a second differential commutating input line.

The differential commutating inputs of the switching cell 4b may be connected to receive the local oscillator commutating signal LO1 having a nominal phase of 0°, but an actual phase of (0+φ)°. The commutating signal inputs of the switching cell 7b may be connected with reverse polarity or in "anti-phase" to the same commutating signal so that the switching cell 7b may receive the inverted commutating signal, which is equivalent to the non-inverted signal shifted in phase by 180°. This interconnection, therefore, may provide a relatively simple phase shifter 12.

Figure 8:
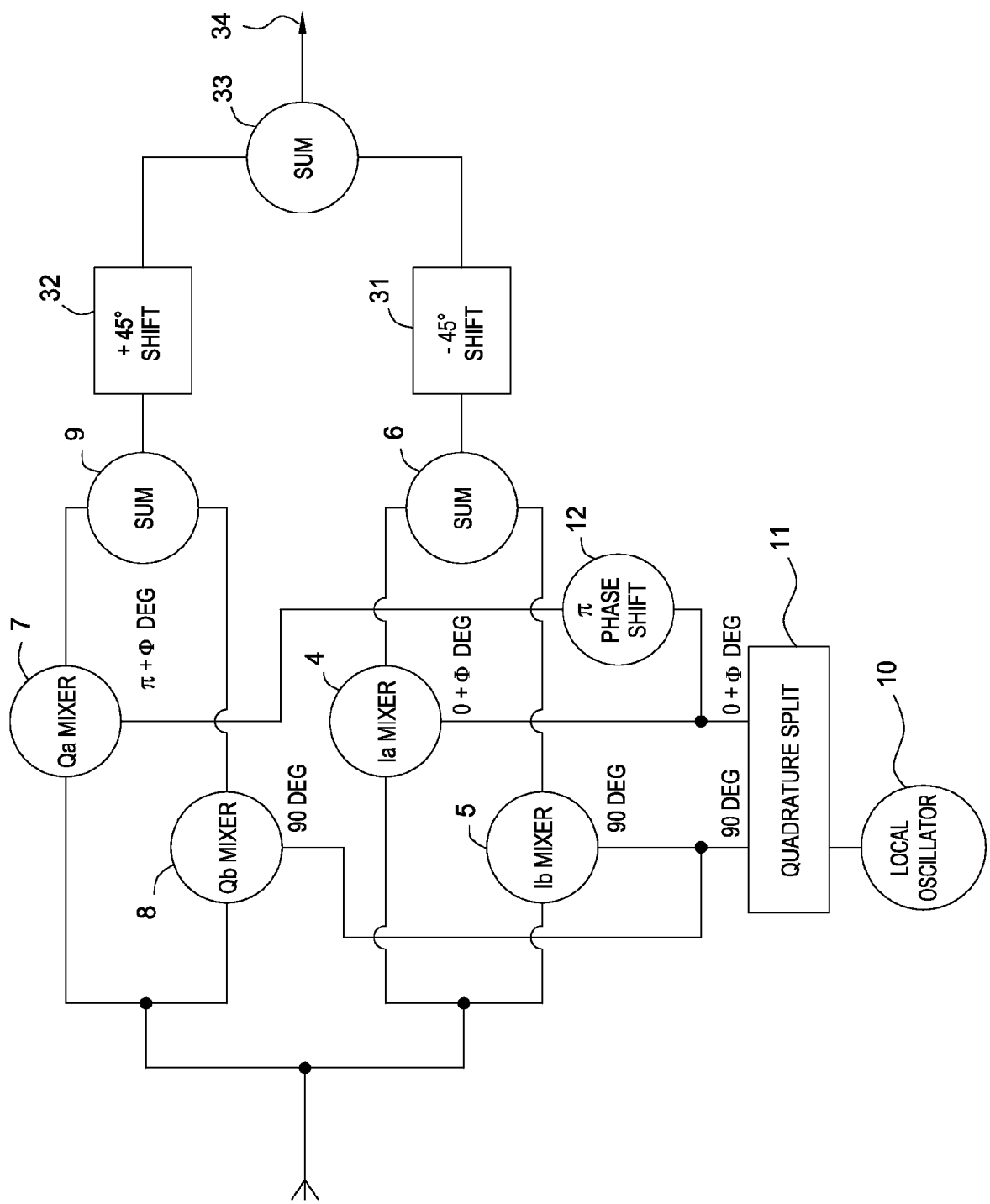
FIG. 8 is a block circuit diagram of a single sideband (SSB) modulator including a frequency changer according to one embodiment of the invention.

FIG. 8 illustrates another application of the frequency changer 4 to 12 shown in FIG. 3. This arrangement may be used as a single sideband (SSB) modulator or as an image cancelling mixer in an effort to provide a classical or near zero intermediate frequency. The I and Q mixers may supply their output signals to phase shifters 31 and 32, respectively, which may provide phase shifts of −45° and +45°, respectively. The outputs of the phase shifters 31 and 32 may be supplied to a summer 33, which may form the vector sum of the phase-shifted I and Q signals. In the case of an SSB modulator, one of the sidebands may be effectively suppressed, whereas the other may be "constructed" and supplied to the output 34 of the modulator. In the case of an image cancelling mixer, the image channel may be effectively suppressed, whereas the selected desired channel may be constructed and supplied to the output 34. The phase shifters 31 and 32 may also perform a filtering function to attenuate adjacent channels.

Figure 9:
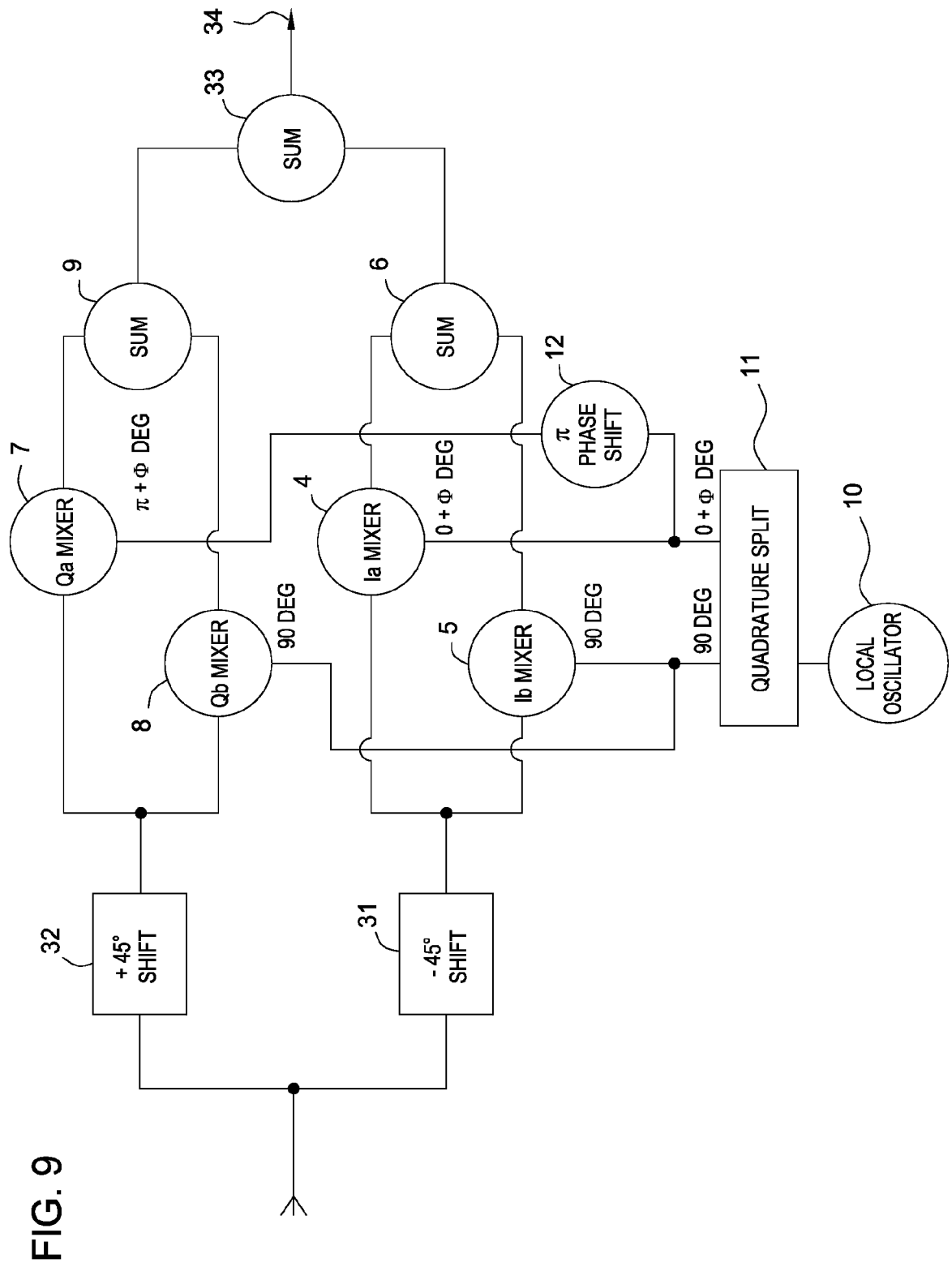
FIG. 9 is a block diagram illustrating a modified form of the modulator illustrated in FIG. 8 according to one embodiment of the invention.

In the case of an image cancelling mixer, the I and Q mixer outputs may be in the intermediate frequency band so that the phase shifters 31 and 32 may be required to perform accurate phase shifting over a relatively small frequency range. However, in the case of a SSB demodulator, the frequency of the mixer output signals may vary substantially so that broadband phase shifters would be required. However, in order to provide the sideband suppression, it may be sufficient for there to be a relative phase shift of 90° between the signal paths including the I and Q mixers. Thus, as illustrated in FIG. 9, the phase shifters 31 and 32 may be disposed ahead of the I and Q mixers, respectively. Because the input signal to such a modulator should be in the same frequency band irrespective of the required output frequency, this arrangement may allow narrow band phase shifters to be used.

Figure 10:
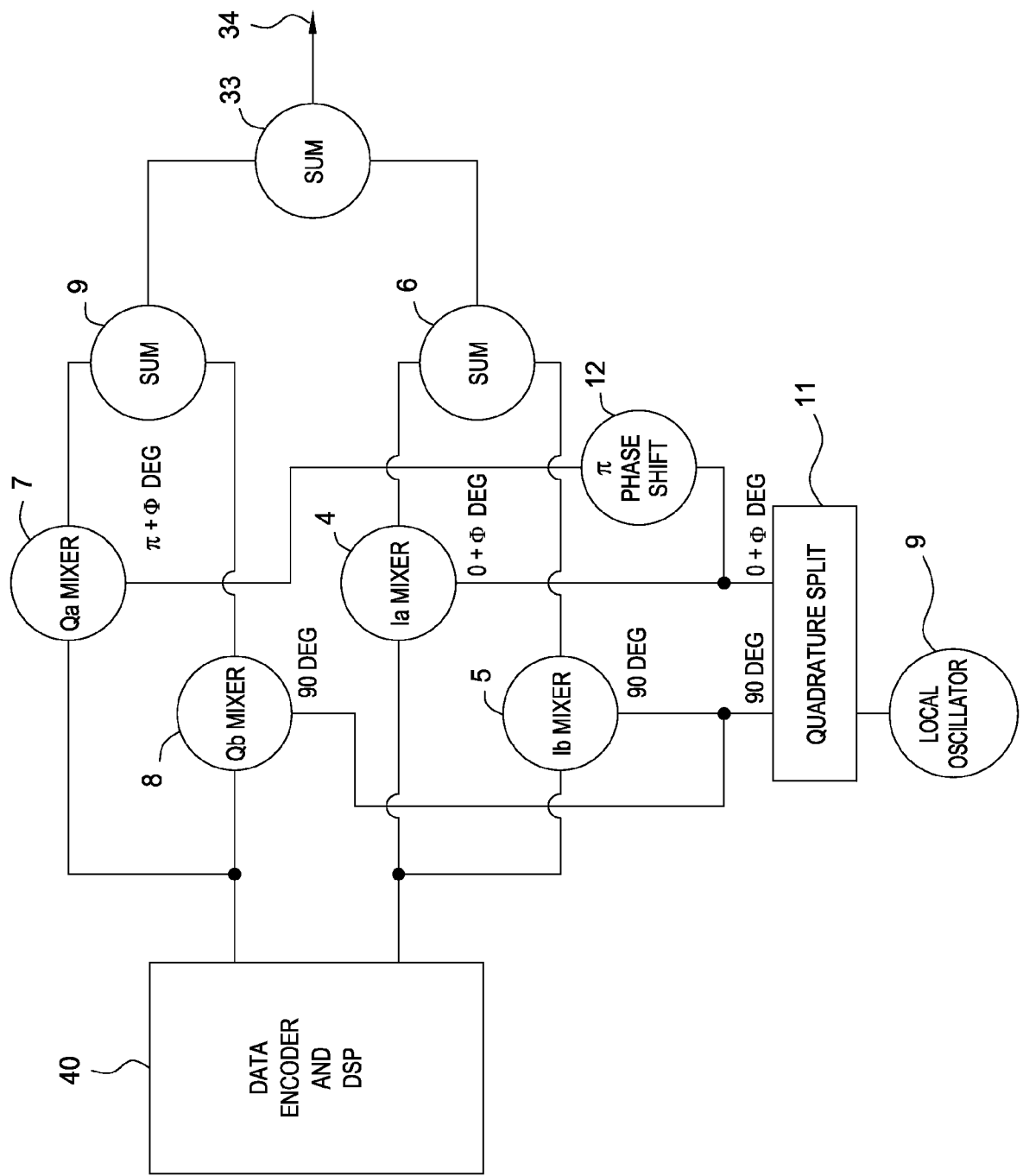
FIG. 10 is a block circuit diagram illustrating another type of modulator including a frequency changer according to one embodiment of the invention.

FIG. 10 illustrates a more general form of modulator using the same quadrature frequency changer 4 to 12 as in FIG. 3. In this case, the I and Q mixers may receive separately generated modulating signals from a data encoder and a digital signal processor (DSP) 40. Such an arrangement may be used to generate a wide variety of types of modulation, for example, including vestigial sideband (VSB) typically used in analog television transmission and quadrature amplitude modulation (QAM) as typically used in cable distribution systems.

While the foregoing is directed to embodiments of the present invention, other and further embodiments of the invention may be devised without departing from the basic scope thereof, and the scope thereof is determined by the claims that follow.

What is claimed is:

1. A quadrature frequency changer comprising:
first and second mixers; and
a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

2. The frequency changer of claim 1, wherein said first to fourth mixing stages comprise the same circuitry.

3. The frequency changer of claim 1, wherein each of said first to fourth mixing stages comprises a Gilbert cell.

4. The frequency changer of claim 1, wherein each of said first and second combiners comprises a summer.

5. The frequency changer of claim 1, wherein said local oscillator is a variable frequency local oscillator.

6. The frequency changer of claim 1, wherein said first and second signals are connected together.

7. The frequency changer of claim 1, wherein said phase changing arrangement is arranged to invert said phase of said first commutating signal to provide said third commutating signal.

8. The frequency changer of claim 7, wherein said first commutating signal is a differential signal and said first and fourth mixing stages have differential inputs connected in anti-phase to receive said first commutating signal to form said phase changing arrangement.

9. A tuner including a quadrature frequency changer comprising first and second mixers and a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

10. A modulator including a quadrature frequency changer comprising first and second mixers and a local oscillator, said local oscillator being arranged to provide first and second commutating signals which are nominally in phase-quadrature and including an arrangement for changing a phase of said first commutating signal by 180° to provide a third commutating signal, said first mixer comprising first and second mixing stages for mixing a first input signal with said first and second commutating signals, respectively, and a first linear combiner for forming a linear combination of output signals of said first and second mixing stages, said second mixer comprising third and fourth mixing stages for mixing a second input signal with said second and third commutating signals, respectively, and a second linear combiner for forming a linear combination of output signals of said third and fourth mixing stages.

* * * * *

UNITED STATES PATENT AND TRADEMARK OFFICE
CERTIFICATE OF CORRECTION

| | | |
|---|---|---|
| PATENT NO. | : 7,609,776 B2 | Page 1 of 1 |
| APPLICATION NO. | : 11/464596 | |
| DATED | : October 27, 2009 | |
| INVENTOR(S) | : Ali et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 682 days.

Signed and Sealed this

Twelfth Day of October, 2010

David J. Kappos
*Director of the United States Patent and Trademark Office*